(12) United States Patent
Liang et al.

(10) Patent No.: US 11,329,647 B2
(45) Date of Patent: May 10, 2022

(54) RADIO FREQUENCY SWITCH CIRCUIT

(71) Applicant: Taiwan Semiconductor Manufacturing Co., Ltd., Hsinchu (TW)

(72) Inventors: Garming Liang, Hsinchu (TW); En-Hsiang Yeh, Hsin-chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 58 days.

(21) Appl. No.: 16/667,867

(22) Filed: Oct. 29, 2019

(65) Prior Publication Data

US 2021/0126631 A1    Apr. 29, 2021

(51) Int. Cl.
*H01L 27/00* (2006.01)
*H03K 17/687* (2006.01)
*H03K 17/16* (2006.01)
*H01L 29/36* (2006.01)
*H01L 29/66* (2006.01)
*H01L 29/78* (2006.01)
*H01L 27/06* (2006.01)

(52) U.S. Cl.
CPC ..... *H03K 17/6871* (2013.01); *H01L 27/0629* (2013.01); *H01L 29/36* (2013.01); *H01L 29/66* (2013.01); *H01L 29/78* (2013.01); *H03K 17/161* (2013.01)

(58) Field of Classification Search
None
See application file for complete search history.

(56) References Cited

U.S. PATENT DOCUMENTS

| | | | | |
|---|---|---|---|---|
| 6,586,806 B1 * | 7/2003 | Pai | ...... | H01L 21/2652 |
| | | | | 257/401 |
| 2002/0140502 A1 * | 10/2002 | Nakatani | ...... | H03F 3/72 |
| | | | | 330/51 |
| 2011/0300898 A1 * | 12/2011 | Homol | ...... | H03F 3/19 |
| | | | | 455/550.1 |

* cited by examiner

*Primary Examiner* — Reema Patel
(74) *Attorney, Agent, or Firm* — JCIPRNET

(57) ABSTRACT

In a communication system, a communication terminal device transmits and receives RF signals frequently. Subsequent to an antenna of the communication terminal device, the communication terminal device includes a radio frequency switch (also referred to as transmit/receive (T/R) switch) that switches between two states at a high frequency, where one state is for receiving RF signal and other state for transmitting RF signal. In the exemplary embodiments of the disclosure, a complementary metal-oxide-semiconductor (CMOS) switch is provided, where the CMOS switch is deigned to have a high reliability by coupling a body of a transistor of the CMOS switch to a bias voltage through a switch, where the insertion loss and isolation are improved for the operation of the CMOS switch.

20 Claims, 9 Drawing Sheets

RADIO FREQUENCY SWITCH CIRCUIT

BACKGROUND

In many electronic devices having wireless communication capability, radio frequency (RF) signal is amplified for processing. For examples, mobile phone, computers, and the likes are equipped with wireless communication, where data are received and transmitted by coupling an antenna to a transmitting portion and a receiving portion of the wireless communication device in a high frequency. A transmit/receive (T/R) switch is equipped therebetween to perform the switching between two signal paths. With a semiconductor T/R switch implemented by complementary metal-oxide-semiconductor (CMOS) transistors, the insertion loss and isolation of the circuitry is important. Since the power of the RF signal may leak through the body of the semiconductor transistors due to the parasitic capacitance of the semiconductor, it is desired to improve the insertion loss and isolation of the T/R switch implemented by the CMOS transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
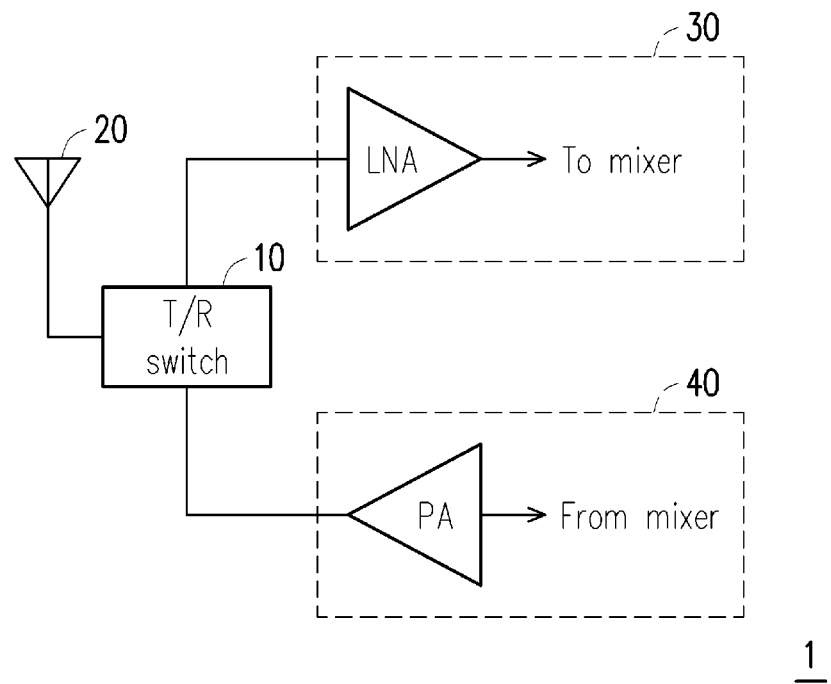
FIG. 1 is a block diagram illustrating a communication terminal device according to some exemplary embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, as used herein, "at least one," "one or more" and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together. It is to be noted that the term "a" or "an" entity refers to one or more of that entity. As such, the terms "a" (or "an"), "one or more" and "at least one" can be used interchangeably herein.

The terms used in this specification generally have their ordinary meanings in the art and in the specific context where each term is used. The use of examples in this specification including examples of any terms discussed herein, is illustrative only, and in no way limits the scope and meaning of the disclosure or of any exemplified term. Likewise, the present disclosure is not limited to various embodiments given in this specification.

In a communication system, a communication terminal device transmits and receives RF signals frequently. Subsequent to an antenna of the communication terminal device, the communication terminal device includes a radio frequency switch (also referred to as transmit/receive (T/R)

switch) that switches between two states at a high frequency, where one state is for receiving RF signal and other state for transmitting RF signal. In a first state, the radio frequency switch couples the antenna to a receiving portion of the communication terminal device for receiving RF signal. In a second state, the radio frequency switch coupled the antenna to a transmitting portion of the communication terminal device for transmitting RF signal. In the exemplary embodiments of the disclosure, a complementary metal-oxide-semiconductor (CMOS) switch is provided, where the CMOS switch is deigned to have a high reliability by coupling a body of a transistor of the CMOS switch to a bias voltage through a switch, where the insertion loss and isolation are improved for the operation of the CMOS switch.

In FIG. 1, a communication terminal device 1 of some exemplary embodiments is illustrated. The communication terminal device includes a radio frequency switch 10, an antenna 20, a receiving portion 30, and a transmitting portion 40. In the exemplary embodiment, the antenna 20 receives or transmits a RF signal. The radio frequency switch 10 is coupled between the antenna 20, the receiving portion 30 and the transmitting portion 40. The radio frequency switch 10 is configured to switch to a first state for connecting the antenna 20 to the receiving portion 30 as to receive the RF signal from external source. On the other hand, the radio frequency switch 10 is configured to switch to a second state for connecting the antenna 20 to the transmitting portion 40 as to transmit the RF signal from the communication terminal device. In the exemplary embodiments, the receiving portion 30 includes various circuits that process the received RF signal. For example, the receiving portion 30 includes a low noise amplifier (LNA) amplifying the received RF signal, band-pass filter, etc. The transmitting portion 40 includes a power amplifier (PA) amplifying the output RF signal, etc. The LNA and PA illustrated in FIG. 1 is for the purpose of illustration, the exemplary embodiments are not intended to limit the receiving portion 30 and the transmitting portion 40 of the communication terminal device, where various components or circuits may be included in the receiving portion 30 and the transmitting portion 40.

In the exemplary embodiments, the communication terminal device 1 may be a mobile phone, a laptop computer, a desktop computer, a stand-alone communication component that is configured to as an add-on module to an electronic device, etc. The stand-alone communication component may be referred to as an electronic circuit that interfaces with an electronic device have a processor by Universal Serial Bus (USB), Peripheral Component Interconnect (PCI), Ethernet interface, Thunderbolt interface, lighting interface, etc.

Figure 2:
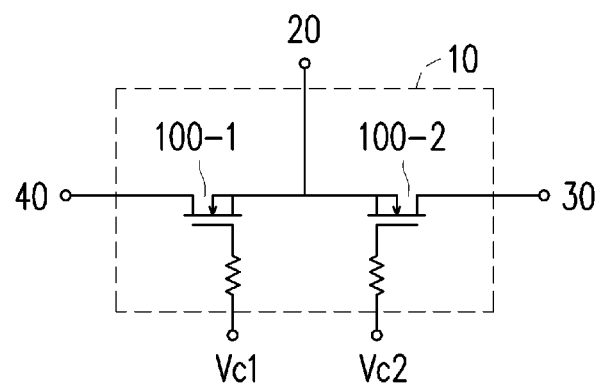
FIG. 2 is a circuit diagram illustrating the radio frequency switch according to some exemplary embodiments of the disclosure.

FIG. 2 is a circuit diagram illustrating the radio frequency switch 10 according to some exemplary embodiments of the disclosure. The radio frequency switch 10 includes a first transistor 100-1 and a second transistor 100-2. The first transistor 100-1 is coupled between the antenna 20 and the transmitting portion 40. The second transistor 100-2 is coupled to between the antenna 20 and the receiving position 30. In detail, the first and second transistors 100-1, 100-2 each includes a first terminal, a second terminal, and control terminal. The first terminal of the first transistor 100-1 is coupled to the antenna 20, the second terminal of the first transistor 100-1 is coupled to the transmitting portion 40, and a control terminal of the first transistor 100-1 is coupled to a first control voltage. The first terminal of the second transistor 100-2 is coupled to the receiving portion 30, the second terminal of the second transistor 100-2 is coupled to the antenna 20, and a control terminal of the second transistor 100-2 is coupled to a second control voltage. The first and second transistors 100-1, 100-2 are controlled by a logic circuit or a processor of the communication device 1 through the first and second control voltages Vc1, Vc2 coupled to a gate of the first transistor 100-1 and a gate of the second transistors 100-2. In some exemplary embodiments of the disclosure the logic circuit or the processor is included in the radio frequency switch. However, the disclosure is not limited thereto. The logic circuit or the processor may being included in the communication terminal device 1 and outputs various control signals, such as the first and second control voltages Vc1, Vc2, a control voltages for controlling a body biasing switch which would be described later, etc.

As described above, the radio frequency switch 10 is configured to switch between the first and second states. In a receiving mode (e.g., the first state), the first transistor 100-1 is configured to be turned on (i.e., close), while the second transistor 100-2 is configured to be turned off (i.e., open), for receiving the RF signal and pass the RF signal to the receiving portion 40. In a transmitting mode (e.g., the second state), the first transistor 100-1 is configured to be turned off (i.e., open), while the second transistor 100-2 is configured to be turned on (i.e., close), for transmitting the RF signal output by the transmitting portion 30. In the exemplary embodiments, the first and second transistors 100-1, 100-2 may be the same type of transistors or different type of transistors, the exemplary embodiments are not intended to limited the implementation of the transistors in the radio frequency switch 10. In the following, the first and second transistors 100-1, 100-2 of the radio frequency switch 10 would be described in detail as a transistor 100.

Figure 3A:
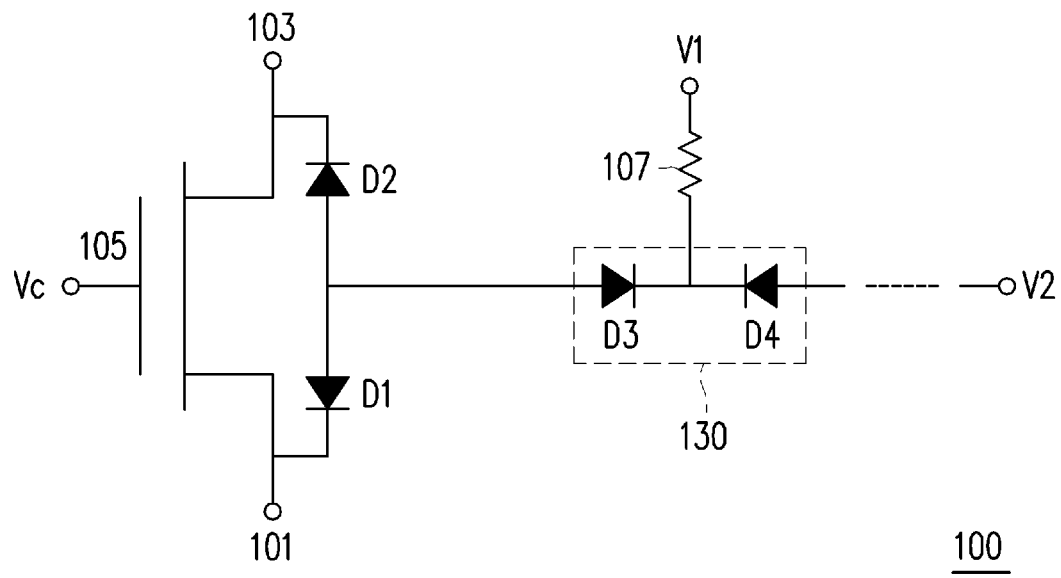
FIG. 3A is a circuit diagram illustrating a transistor of a radio frequency switch according to some exemplary embodiments of the disclosure.
Figure 3B:
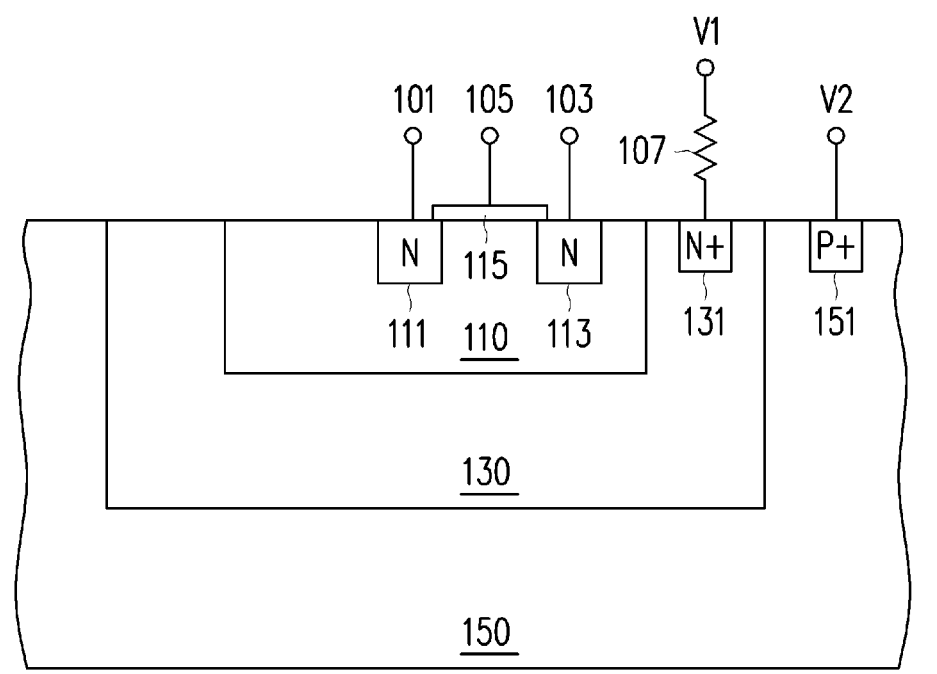
FIG. 3B is a diagram illustrating a cross-section of a transistor of the radio frequency switch according to some exemplary embodiments of the disclosure.

FIG. 3A is a circuit diagram illustrating a transistor 100 of a radio frequency switch 10 according to some exemplary embodiments of the disclosure. FIG. 3B is a diagram illustrating a cross-section of the transistor 100 according to some exemplary embodiments of the disclosure. With reference to FIG. 3A, The transistor 100 includes a first terminal 101, a second terminal 103, and a control terminal 105. Taking the first transistor 100-1 illustrated in FIG. 2 as example, the first terminal 101 is a drain of the transistor 100 coupled to the transmitting portion 40 of the communication terminal device 1. The second terminal 103 is a source of the transistor 100 coupled to the antenna 20. In addition, the control terminal 105 is coupled to the first control voltage Vc1 (referred to as a control voltage Vc), where a logic circuit or a processor of the communication terminal device 1 turns on or off the transistor 100 through the first control voltage Vc1.

On the other hand, the transistor 100 may be the second transistor 100-2 illustrated in the FIG. 2. As illustrated in FIG. 2, the first terminal 101 (e.g., drain) is coupled to the receiving portion 30 of the communication terminal device 1. The second terminal 103 (e.g., source) is coupled to the antenna 20. In addition, the control terminal 105 is coupled to the second control voltage Vc2 (referred to as a control voltage Vc), where the control circuit or the processor of the communication terminal device 1 turns off or on the transistor 100 through the second control voltage Vc2. The exemplary embodiments, the first and second control voltages Vc1, Vc2 may be voltages having opposite potentials, so as to turn on (or turn off) the first transistor 100-1 and turn off (or turn on) the second transistor 100-2 for different states or modes of the radio frequency switch 10 (i.e., receiving mode or transmitting mode). However, in some exemplary embodiments, the logic circuit or the processor may output one control voltage. The control voltage may be coupled to the first transistor 100-1, while the same control voltage is coupled to the second transistor 100-2 through an invertor that inverts the logic of the control voltage.

In the exemplary embodiment, a body substrate of the transistor 100 is further coupled to a first bias voltage V1 and a second bias voltage V2 for biasing the body substrate of the transistor 100. This substrate bias technique avoids or reduces the body effect of the substrate, avoids or reduces the likelihood of gate oxide breakdown, and/or provides a relatively low or acceptable radio frequency switch insertion loss. In the exemplary embodiments of the disclosure, the first and second bias voltages V1, V2 are used for differentiating the bias voltages coupled to different portion of the transistor. In other words, the first and second bias voltages V1, V2 are different. However, naming of the bias voltage is not intended to limit the first bias voltage being greater than the second bias voltage, or vice versa. In some embodiments, the first bias voltage V1 may be a power voltage VDD received from a power supply for powering the radio frequency switch 10, and the second bias voltage V2 may be a ground voltage. In some embodiments, the first bias voltages V1 may be referred to as a high voltage as compared to the second bias voltage V2 which may be referred to as a low voltage, for the high and low voltage may be divided from the power voltage VDD. In some alternative embodiments, the first and second bias voltages may have opposite polarity, where the first bias voltage V1 may be a positive voltage and the second bias voltage being a negative voltage. The disclosure is not intended to limit the implementation of the first and second bias voltages.

In FIG. 3A, parasitic diodes D1, D2, D3, D4 are shown, which are junctions formed between different types of doping regions and would be explained in further detail with FIG. 3B. With reference to FIG. 3B, a cross section of the transistor 100 is shown according to some exemplary embodiments of the disclosure. The transistor 100 includes a first well 110, a second well 130, and a substrate 150. In the exemplary embodiments, the first well 110 may be doped as a P type well. The second well 130 may be doped as a N type well surrounding the first well 110. In addition, the substrate 150 may be doped as a P type substrate. In the specification, the description of P type and N type of the wells and substrate may be referred to as a first type of dopant or a second type of dopant.

In the exemplary embodiments, the first and second terminals (source and drain) of the transistor 100 is formed in the first well 110 with a type of dopant different than the first well 110. For example, the first well 110 may be a P type well, then the first and second terminals may be a first region 111 and a second region 113 doped with N type dopant. The transistor 100 also includes a gate 115 disposed on the first well 110 between the first and second regions 111, 113. The first region 111, the second region 113, and the gate 115 form a N-type MOSFET. In the exemplary embodiments, the first region 111 is coupled to the first terminal 101, the second region 113 is coupled to the second terminal 103, and the gate 115 is coupled to the control terminal 105.

With reference to FIGS. 3A and 3B, parasitic diodes are formed between the wells and active regions of the transistor 100. In the exemplary embodiments, the parasitic diode D1 is formed between the first region 111 and the first well 110. The parasitic diode D2 is formed between the second region 113 and the first well 110. The parasitic diode D3 is formed between the first well 110 and the second well 130. The parasitic diode D4 is formed between the second well 130 and the substrate 150. Without proper control of the wells of the transistor 100, parasitic diodes may become active and increase the power consumption and potentially render the communication terminal device dysfunctional, or other reliability issues. Therefore, it is desired to properly bias the transistor 100 of the radio frequency switch 10 during the operation of receiving and transmitting for improving the isolation and insertion of the radio frequency switch 10.

In the exemplary embodiments, the first well 130 includes a third region having a high concentration of the same type of dopant as the first well 130 which is a first third region 131 for receiving the first bias voltage V1. The substrate 150 includes a fourth region 151 having a high concentration of the same type of dopant as the substrate 150 for coupling the substrate to the second bias voltage V2. The third and fourth regions 131, 151 couples the bias voltages V1, V2 to the first well 130 and the substrate 150, respectively, so as to prevent the influence of the parasitic diodes D1, D2, D3, D4 to the active RF signal pathway provided by the transistor 100. In some exemplary embodiment, the third region 131 may be coupled to the first bias voltage V1 through a resistor 107. The transistor 100 illustrated in FIGS. 3A and 3B improves the insertion loss by coupling the first bias voltage V1 to the first well 130, so as to break the loss path.

Figure 3C:
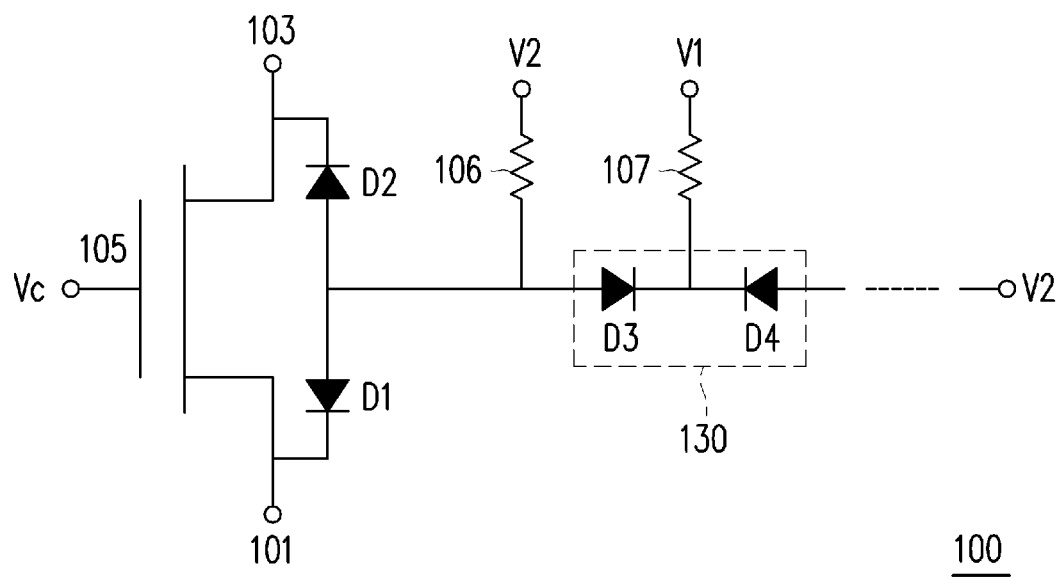
FIG. 3C is a circuit diagram illustrating a transistor of switch according to some exemplary embodiments of the disclosure.

FIG. 3C is circuit diagram illustrating a transistor 100 of a radio frequency switch 10 according to some exemplary embodiments of the disclosure. In the embodiments, the body of the transistor 100 is connected to a body voltage (e.g., a second bias voltage V2) to avoid latch-up occurrence. The differences between the transistor illustrated in FIGS. 3A and 3B is the addition of a resistor 106 coupled to the body of the transistor (e.g., a well that directly encompasses the source and drain region.) With reference to FIG. 3C, the second bias voltage V2 is coupled to the body of the transistor 100 through a resistor 106. The resistor 106 has a large resistance, and in a high frequency application, the connection between the second bias voltage V2 and the body of the transistor 100 would be open circuit.

Figure 4A:
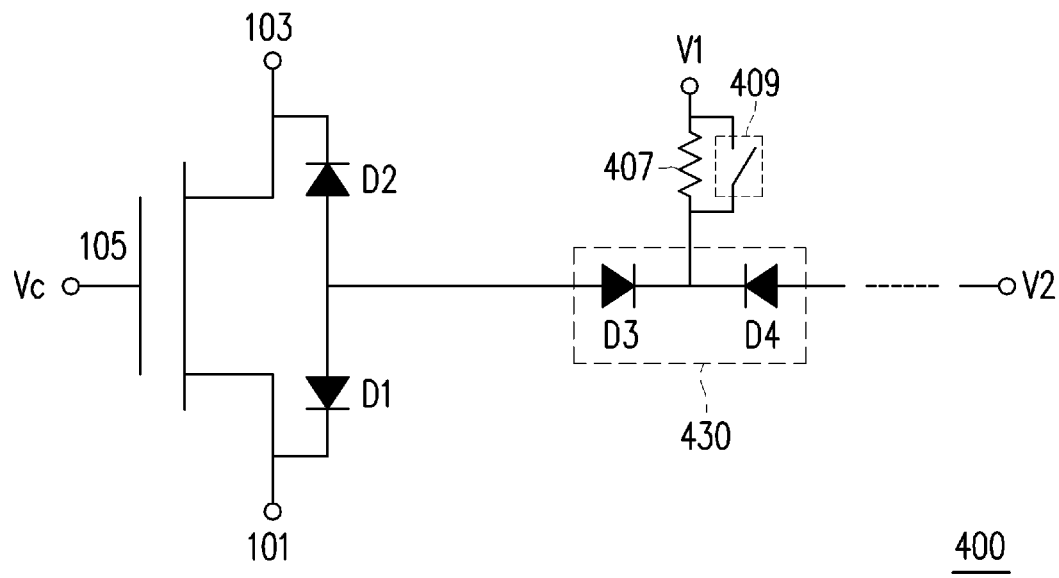
FIG. 4A is a circuit diagram illustrating a transistor of a radio frequency switch according to some exemplary embodiments of the disclosure.
Figure 4B:
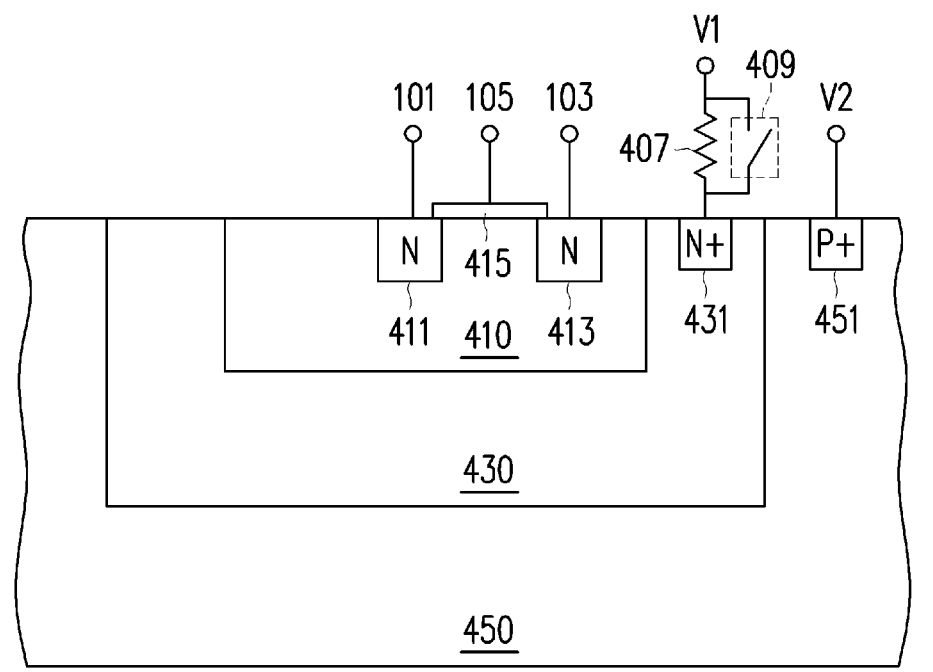
FIG. 4B is a diagram illustrating a cross-section of the transistor according to some exemplary embodiments of the disclosure.

FIG. 4A is a circuit diagram illustrating a transistor 400 of a radio frequency switch 10 according to some exemplary embodiments of the disclosure. FIG. 4B is a diagram illustrating a cross-section of the transistor 400 according to some exemplary embodiments of the disclosure. The transistor 400 may be utilized for any one of the first and second transistors 100-1, 100-2 as illustrated in FIG. 2. With reference to FIGS. 4A and 4B, the transistor 400 includes a first region 411 coupled to a first terminal 101, a second region 413 coupled to a second terminal 103, and a gate 415 coupled to a control terminal 105. Similar to the exemplary embodiment illustrated in FIGS. 3A and 3B, the transistor 400 is a triple well structure that includes a first well 410 of a second type, a second well 430 of a first type, and a substrate 450 of the second type. In the first well 410, the first and second regions 411 and 413 are formed with a dopant of the first type, and the gate 415 is disposed on the first well 410 between the first and second regions 411, 413. The second well 430 includes a third region 431 doped with a high concentration of the first type dopant to act as a contact for coupling the second well 430 to a first bias voltage V1. The substrate 450 includes a fourth region 451 doped with a high concentration of the second type dopant to act as a contact for coupling the substrate 450 to a second bias voltage V2.

In the exemplary embodiments, the connection between the first bias voltage V1 and the third region 431 further includes a switch 409 connected in parallel with a resistor 407 as compared to the exemplary embodiment illustrated in FIGS. 3A and 3B. The addition of the switch 409 further improves the insertion loss and the isolation of the transistor 400 during the operation of the radio frequency switch 10. In the exemplary embodiments, the operation of the switch 409 may be controlled by the logic circuit or the processor. In a state where the transistor 400 is turned on, the switch 409 is turned off (i.e., open) to cut the leakage of transmission power to the V1, which improves the insertion loss. On the other hand, in a state where the transistor 400 is turned off, the switch 409 is turned on (i.e., close), so as to improve the isolation of the transistor 400.

Figure 5A:
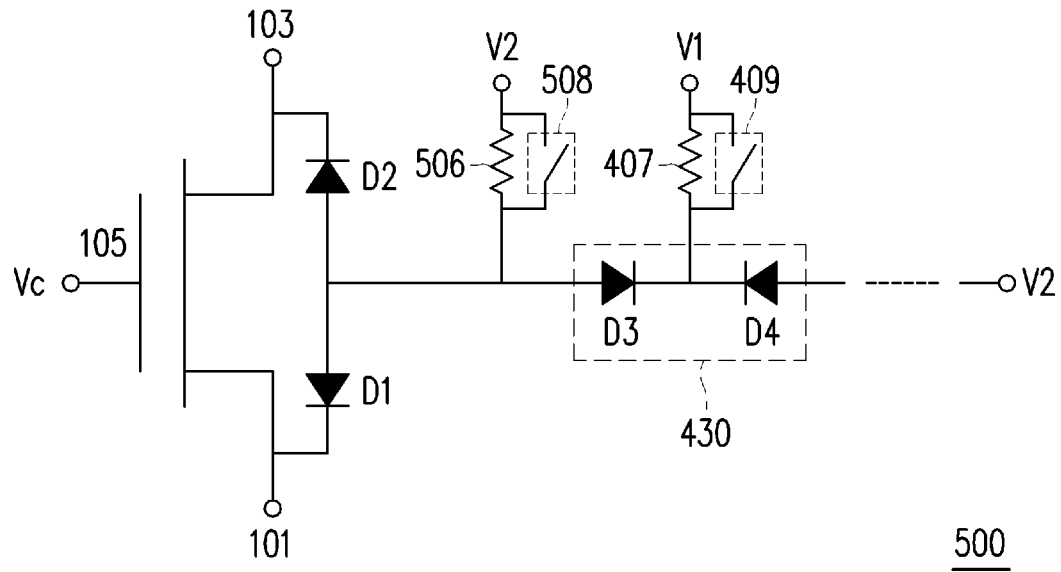
FIG. 5A is a circuit diagram illustrating a transistor of a radio frequency switch according to some exemplary embodiments of the disclosure.
Figure 5B:
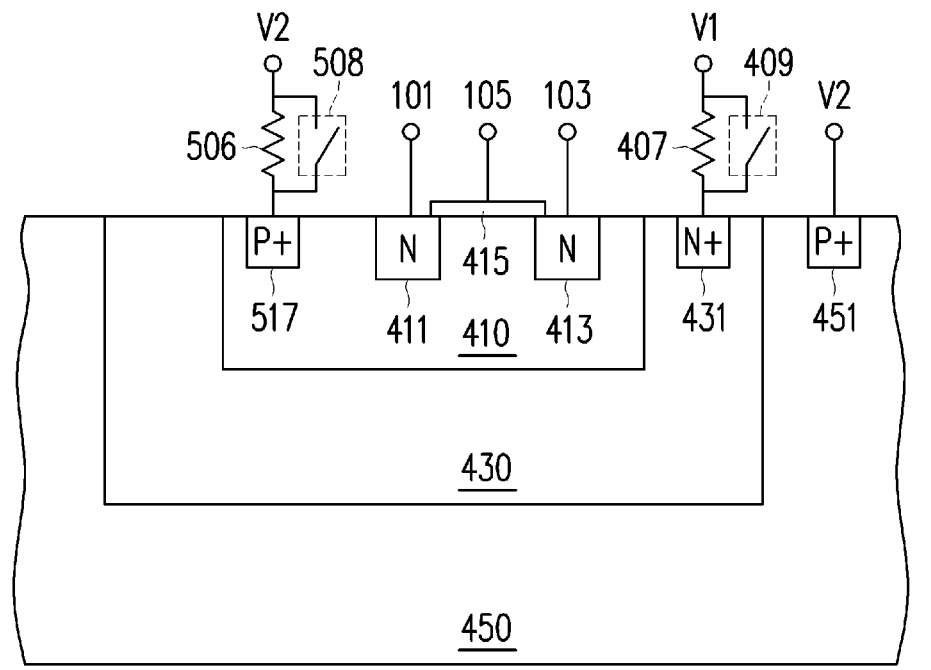
FIG. 5B is a diagram illustrating a cross-section of the transistor according to some exemplary embodiments of the disclosure.

FIG. 5A is a circuit diagram illustrating a transistor 500 of a radio frequency switch 10 according to some exemplary embodiments of the disclosure. FIG. 5B is a diagram illustrating a cross-section of the transistor 500 according to some exemplary embodiments of the disclosure. The transistor 500 may be utilized for any one of the first and second transistors 100-1, 100-2 as illustrated in FIG. 2. As compared to the transistor 400 illustrated in FIGS. 4A and 4B, the transistor further bias the first well 410 with the second bias voltage V2. In the exemplary embodiments, the first well 410 of the first type further includes a third region 517 doped with a higher concertation of first type of dopant. The third region 517 is coupled to the second bias voltage V2 through a resistor 506 and a switch 508 connected in parallel with the resistor 506.

In the exemplary embodiments, the operation of the switch 409 and the switch 508 may be controlled by the logic circuit or the processor. In a state where the transistor 500 is turned on, the switch 409 and the switch 508 are turned off (i.e., open) to cut the leakage of transmission power to the V1, which improves the insertion loss. On the other hand, in a state where the transistor 500 is turned off, the switch 409 and the switch 508 are turned on (i.e., close), so as to improve the isolation of the transistor 500.

Figure 6A:
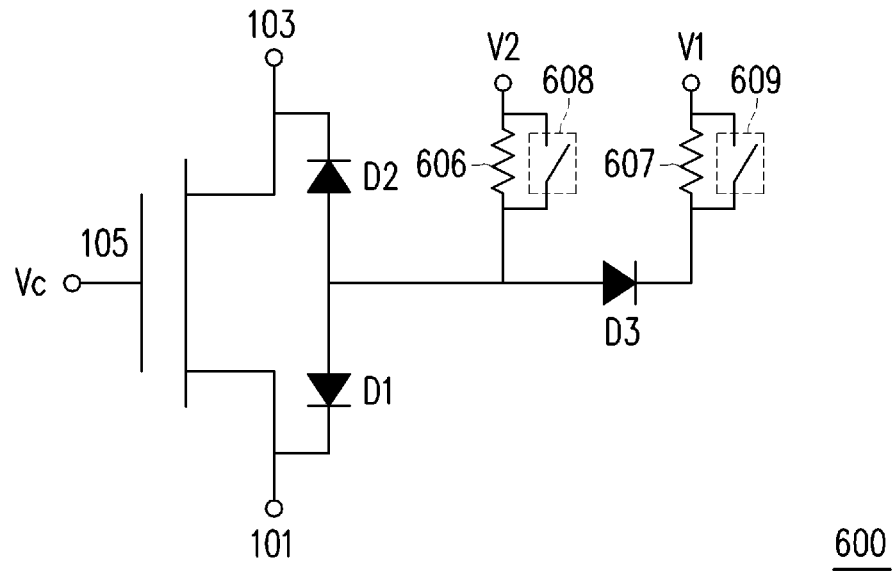
FIG. 6A is a circuit diagram illustrating a transistor of a radio frequency switch according to some exemplary embodiments of the disclosure.
Figure 6B:
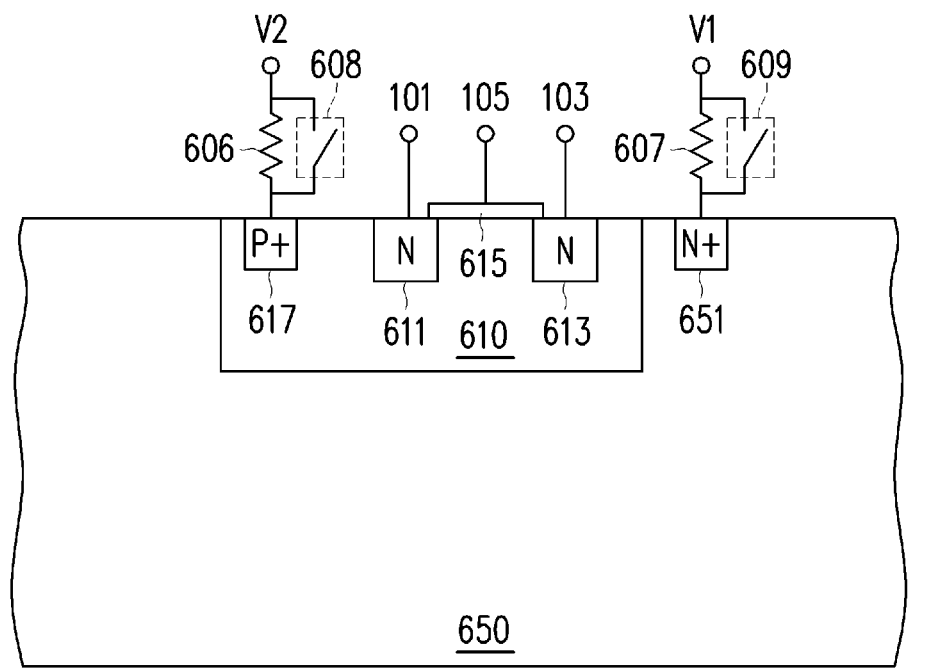
FIG. 6B is a diagram illustrating a cross-section of the transistor according to some exemplary embodiments of the disclosure.

FIG. 6A is a circuit diagram illustrating a transistor 600 of a radio frequency switch 10 according to some exemplary embodiments of the disclosure. FIG. 6B is a diagram illustrating a cross-section of the transistor 600 according to some exemplary embodiments of the disclosure. The transistor 400 may be utilized for any one of the first and second transistors 100-1, 100-2 as illustrated in FIG. 2. As compared to the transistor 500 illustrated in FIGS. 5A and 5B, the transistor 600 is a double well structure. With reference to FIGS. 6A and 6B, a transistor 600 includes a first well 610 of a second type and a substrate 650 of a first type surrounding the first well 610. The transistor 600 includes a first region 611 doped with first type dopant in the first well 610, a second region 613 doped with first type dopant in the first well 610, and a gate disposed on the first well 610 between the first and second regions 611, 613. The first region 611 is coupled to the first terminal 101, the second region 613 is coupled to the second terminal 103, and the gate 615 is coupled to the control terminal 105. As illustrated in FIG. 6, the double wall structure of the transistor 600 would not have include the parasitic diode D4 between a deep well and the substrate 650.

In the exemplary embodiments, the substrate 650 of the first type includes a third region 651 doped with a high concentration of the first type dopant to act as a contact for coupling the substrate 650 to a first bias voltage V1. The third region 651 is coupled to the first bias voltage V1 through a resistor 607 and a switch 609 connected in parallel with the resistor 607. In the exemplary embodiment, the operation of the switch improves the insertion loss and isolation of the transistor 600. With reference to FIG. 6A, the operation of the switch 609 may be controlled by the logic circuit or the processor of the communication terminal device 1. In a state where the transistor 600 is turned on, the switch 609 is turned off (i.e., open) to cut the leakage of transmission power to the V1, which improves the insertion loss. On the other hand, in a state where the transistor 600 is turned off, the switch 609 is turned on (i.e., close), so as to improve the isolation of the transistor 600.

In some exemplary embodiments, the first well 610 further includes a fourth region 617 doped with a high concentration of the second type dopant, where the fourth region 617 act as a contact for coupling the first well 610 to a second bias voltage V2. The third region 617 is coupled to the second bias voltage V2 through a resistor 606 and a switch 608 connected in parallel with the resistor 606. In the exemplary embodiment, the operation of the switches 608, 609 improves the insertion loss and isolation of the transistor 600. With reference to FIG. 6A, the operation of the switch 608 and the switch 609 may be controlled by the logic circuit or the processor of the communication terminal device 1. In a state where the transistor 600 is turned on, the switch 608 and the switch 609 are turned off (i.e., open) to cut the leakage of transmission power to the V1, which improves the insertion loss. On the other hand, in a state where the transistor 600 is turned off, the switch 608 and the switch 609 are turned on (i.e., close), so as to improve the isolation of the transistor 600.

Figure 7A:
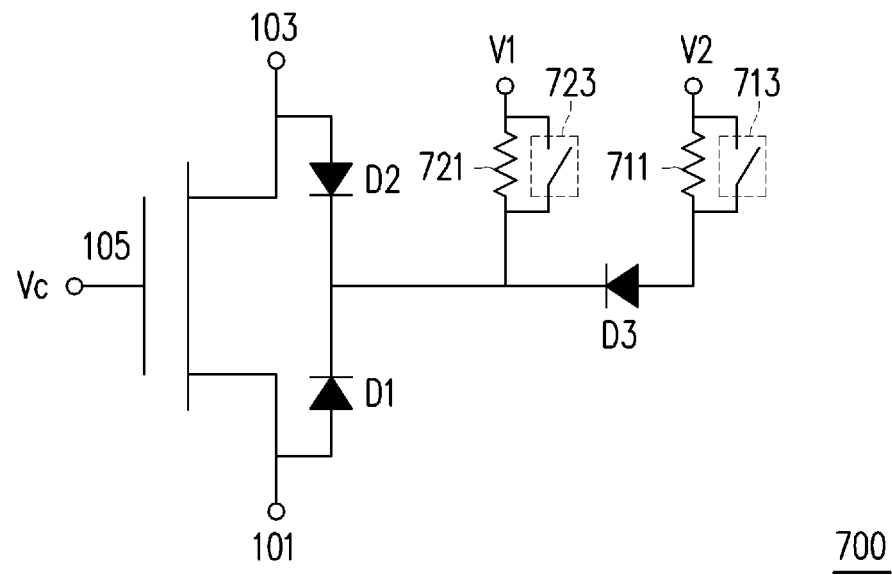
FIG. 7A is a circuit diagram illustrating a transistor of a radio frequency switch according to some exemplary embodiments of the disclosure.
Figure 7B:
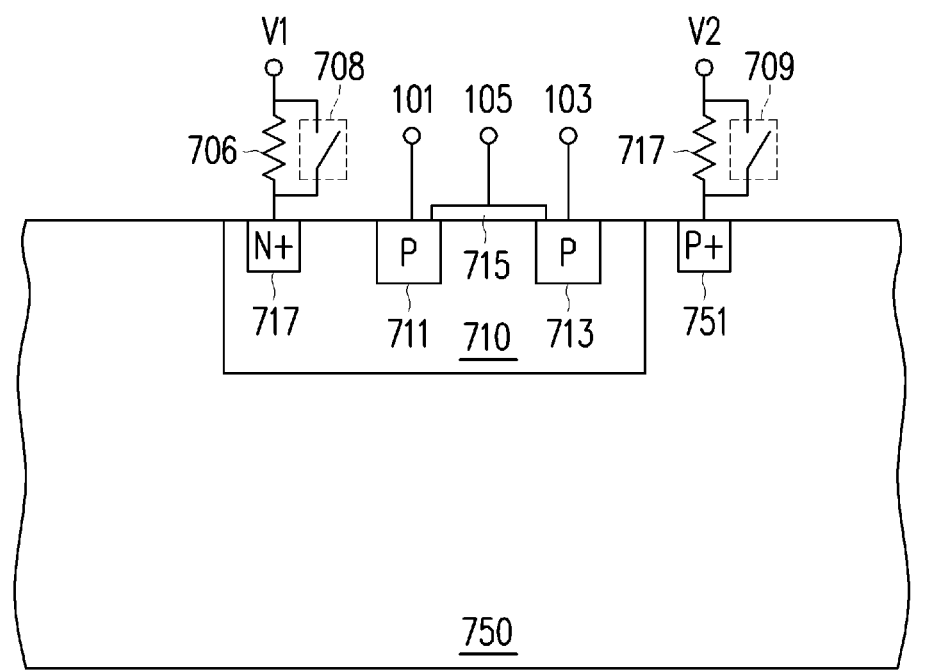
FIG. 7B is a diagram illustrating a cross-section of the transistor according to some exemplary embodiments of the disclosure.

FIG. 7A is a circuit diagram illustrating a transistor 700 of a radio frequency switch 10 according to some exemplary embodiments of the disclosure. FIG. 7B is a diagram illustrating a cross-section of the transistor 700 according to some exemplary embodiments of the disclosure. The transistor 700 may be utilized for any one of the first and second transistors 100-1, 100-2 as illustrated in FIG. 2. As compared to the transistor 600 illustrated in FIGS. 6A and 6B, the transistor 700 illustrated in FIGS. 7A-7B is P-type transistor. With reference to FIGS. 7A and 7B, a transistor 700 includes a first well 710 of a first type and a substrate 750 of a second type surrounding the first well 710. The transistor 700 includes a first region 711 doped with second type dopant in the first well 710, a second region 713 doped with second type dopant in the first well 710, and a gate 715 disposed on the first well 710 between the first and second regions 711, 713. The first region 711 is coupled to the first terminal 101, the second region 713 is coupled to the second terminal 103, and the gate 715 is coupled to the control terminal 105.

In the exemplary embodiments, the substrate 750 of the second type includes a third region 751 doped with a high concentration of the second type dopant to act as a contact for coupling the substrate 750 to a second bias voltage V2. The third region 751 is coupled to the second bias voltage V2 through a resistor 707 and a switch 709 connected in parallel with the resistor 707. In the exemplary embodiment, the operation of the switch 709 improves the insertion loss and isolation of the transistor 700. With reference to FIG. 7A, the operation of the switch 709 may be controlled by the logic circuit or the processor of the communication terminal device 1. In a state where the transistor 700 is turned on, the switch 709 is turned off (i.e., open) to cut the leakage of transmission power, which improves the insertion loss. On the other hand, in a state where the transistor 700 is turned off, the switch 709 is turned on (i.e., close), so as to improve the isolation of the transistor 700.

In some exemplary embodiments, the first well 710 further includes a fourth region 717 doped with a high concentration of the first type dopant, where the fourth region 717 act as a contact for coupling the first well 710 to a first bias voltage V1. The third region 717 is coupled to the first bias voltage V1 through a resistor 706 and a switch 708 connected in parallel with the resistor 706. In the exemplary embodiment, the operation of the switches 708, 709 improves the insertion loss and isolation of the transistor 700. With reference to FIG. 6A, the operation of the switch 708 and the switch 709 may be controlled by the logic circuit or the processor of the communication terminal device 1. In a state where the transistor 700 is turned on, the switch 708 and the switch 709 are turned off (i.e., open) to cut the leakage of transmission power to the V1, which improves the insertion loss. On the other hand, in a state where the transistor 700 is turned off, the switch 708 and the switch 709 are turned on (i.e., close), so as to improve the isolation of the transistor 700.

Figure 8A:
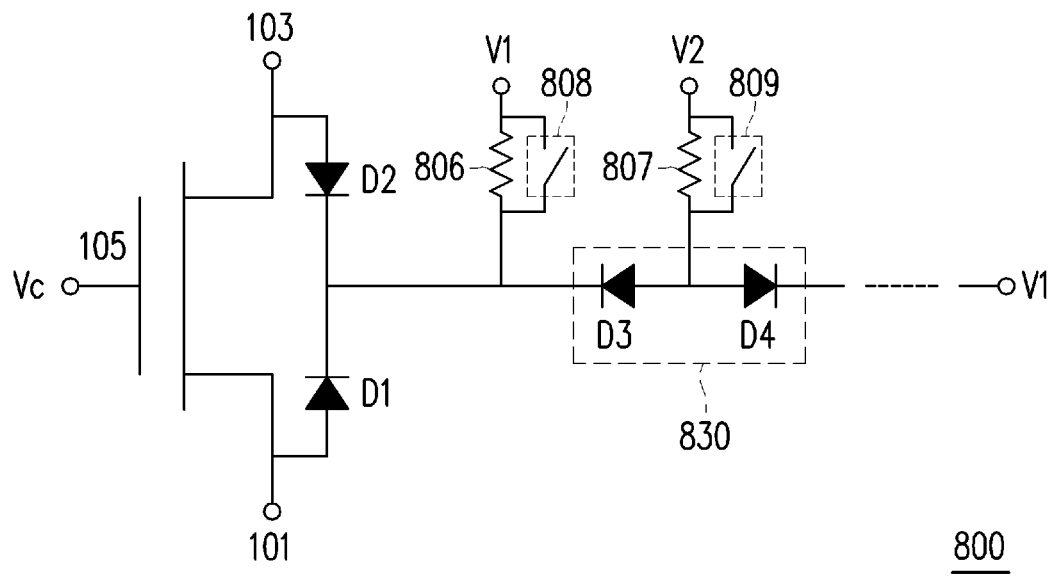
FIG. 8A is a circuit diagram illustrating a transistor of a radio frequency switch according to some exemplary embodiments of the disclosure.
Figure 8B:
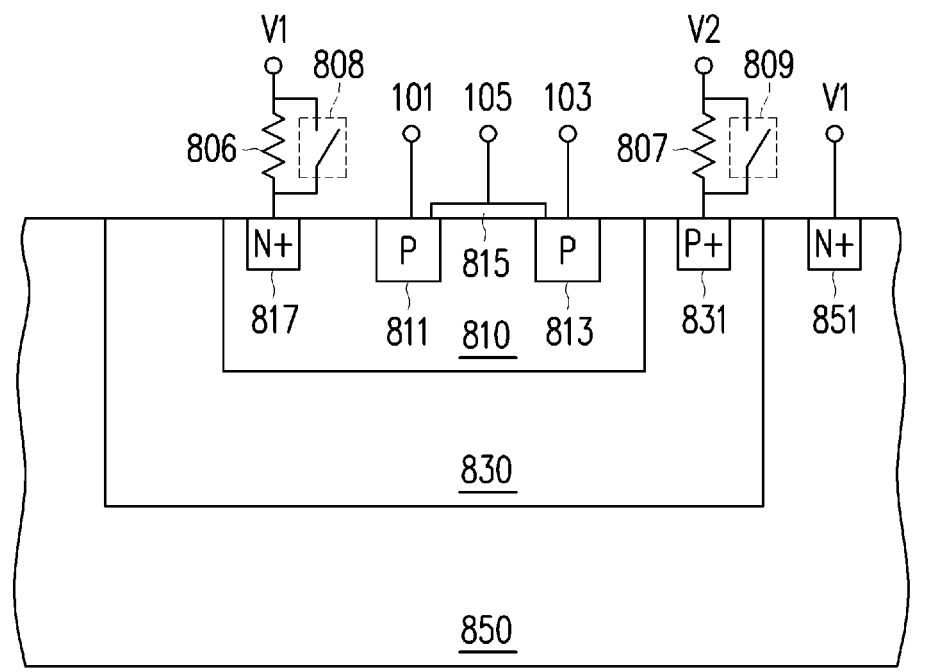
FIG. 8B is a diagram illustrating a cross-section of the transistor according to some exemplary embodiments of the disclosure.

FIG. 8A is a circuit diagram illustrating a transistor 800 of a radio frequency switch 10 according to some exemplary embodiments of the disclosure. FIG. 8B is a diagram illustrating a cross-section of the transistor 800 according to some exemplary embodiments of the disclosure. The transistor 800 may be utilized for any one of the first and second transistors 100-1, 100-2 as illustrated in FIG. 2. As compared to the transistor 500 illustrated in FIGS. 5A and 5B, the transistor 800 is P-type transistor with triple wall structure. With reference to FIGS. 8A and 8B, a transistor 800 includes a first well 810 of a first type, a second well 830 of a second type surrounding the first well 810 and a substrate 850 of the first type surrounding the second well 830. The transistor 800 includes a first region 811 doped with second type dopant in the first well 810, a second region 813 doped with second type dopant in the first well 810, and a gate 815 disposed on the first well 810 between the first and second regions 811, 813. The first region 811 is coupled to the first terminal 101, the second region 813 is coupled to the second terminal 103, and the gate 815 is coupled to the control terminal 105.

In the exemplary embodiments, the second well 830 includes a third region 831 doped with a high concentration of the second type dopant to act as a contact for coupling the second well 830 to a second bias voltage V2. The substrate 450 includes a fourth region 451 doped with a high concentration of the first type dopant to act as a contact for coupling the substrate 850 to a first bias voltage V1. The third region 831 is coupled to the second bias voltage V2 through a resistor 807 and a switch 809 connected in parallel with the resistor 807. In the exemplary embodiment, the operation of the switch 809 improves the insertion loss and isolation of the transistor 800. With reference to FIG. 8A, the operation of the switch 809 may be controlled by the logic circuit or the processor of the communication terminal device 1. In a state where the transistor 800 is turned on, the switch 809 is turned off (i.e., open) to cut the leakage of transmission power, which improves the insertion loss. On the other hand, in a state where the transistor 800 is turned off, the switch 809 is turned on (i.e., close), so as to improve the isolation of the transistor 800.

In some exemplary embodiments, the first well 810 further includes a fourth region 817 doped with a high concentration of the first type dopant, where the fourth region 817 act as a contact for coupling the first well 810 to a first bias voltage V1. The third region 817 is coupled to the first bias voltage V1 through a resistor 806 and a switch 808 connected in parallel with the resistor 806. In the exemplary embodiment, the operation of the switches 808, 809 improves the insertion loss and isolation of the transistor 700. With reference to FIG. 8A, the operation of the switch 808 and the switch 809 may be controlled by the logic circuit or the processor of the communication terminal device 1. In a state where the transistor 800 is turned on, the switch 808 and the switch 809 are turned off (i.e., open) to cut the leakage of transmission power to the V1, which improves the insertion loss. On the other hand, in a state where the transistor 800 is turned off, the switch 808 and the switch 809 are turned on (i.e., close), so as to improve the isolation of the transistor 800.

Figure 9:
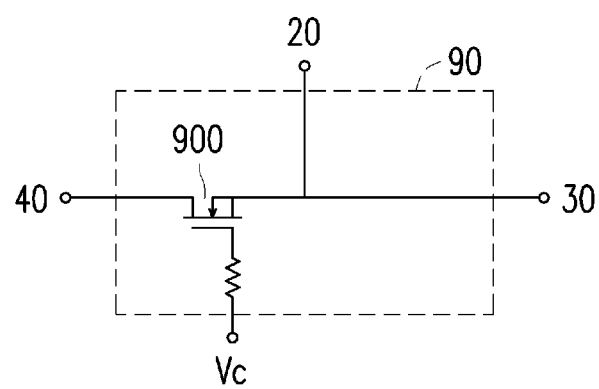
FIG. 9 is a circuit diagram illustrating a radio frequency switch according to some exemplary embodiments of the disclosure.

FIG. 9 is a circuit diagram illustrating a radio frequency switch 90 according to some exemplary embodiments of the disclosure. In the exemplary embodiments, only the RF path between the antenna 20 and the transmitting portion 40 of the communication terminal device 1 is coupled to a transistor 900. In the receiving mode, the transistor 900 may be turned off. In the transmitting mode, the transistor 900 may be turned on to allow the output RF signal to be transmitted to the antenna 20 from the transmitting portion 40. In the disclosure, any of the transistors illustrated in FIGS. 4A-8B may be utilized to implement the transistor 900.

Based on the various exemplary embodiments described above, the insertion loss and isolation of a complementary metal-oxide-semiconductor (CMOS) radio frequency switch may be improved by coupling a body of a transistor to a bias voltage through a switch according to the operation of the transistor.

According to some exemplary embodiments, a radio frequency switch is disclosed. The radio frequency switch, comprising a substrate having a portion of a first-type, a first heavily doped region of the first-type disposed in the portion of the first-type, a first well of the second-type disposed in the portion of the first-type, a first doped region and a second doped region disposed in the first well, a gate disposed on the first well between the first and second doped regions, and a first switch configured to electrically couple the first heavily doped region to a first bias voltage according to a control voltage coupled to the gate.

According to some exemplary embodiments, a radio frequency switch receiving a radio frequency (RF) signal form an antenna is disclosed. The radio frequency switch includes a transistor coupled to the antenna. The transistor includes a first well, a substrate having a portion surrounding the first well, a first doped region disposed in the first well, and coupled to the antenna, a second doped region disposed in the first well, and coupled to the transmitting portion, and a gate region disposed on the first well between the first and second doped region. The radio frequency switch further includes a first heavily doped region of a same type of dopant as the portion of the substrate, a first switch configured to electrically couple the first heavily doped region to a first bias voltage according to a control voltage coupled to the gate region.

According to some exemplary embodiments, a radio frequency switch is disclosed. The radio frequency switch includes a switch and a transistor having a first terminal, a second terminal, a gate terminal, and a body. The switch is coupled between the body of the transistor and a first bias voltage and configured to couple the body of the transistor to a bias voltage when the transistor is turned off.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A radio frequency switch, comprising:
a substrate, having a portion of a first-type;
a first heavily doped region of the first-type, disposed in the portion of the first-type;
a first well of the second-type, disposed in the portion of the first-type;
a first doped region coupled to an antenna and a second doped region coupled to a receiving portion, disposed in the first well;
a gate, disposed on the first well between the first and second doped regions; and
a first switch, configured to electrically couple the first heavily doped region to a first bias voltage according to a control voltage coupled to the gate.

2. The radio frequency switch of claim 1, further comprising:
a second heavily doped region of the second-type, disposed in the first well of the second-type; and
a second switch, configured to electrically couple the second heavily doped region to a second bias voltage according to the control voltage coupled to the gate.

3. The radio frequency switch of claim 1, wherein the portion of the first type is an entire substrate.

4. The radio frequency switch of claim 1, wherein the substrate is of the second-type, and the portion of the first type is a second well of the first-type in the substrate.

5. The radio frequency switch of claim 4, wherein the substrate further comprising a third heavily doped region of the second-type.

6. The radio frequency switch of claim 5, wherein the third heavily doped region is coupled to a second bias voltage.

7. The radio frequency switch of claim 1, further comprising:
a resistor coupled in parallel with the first switch.

8. A radio frequency switch, receiving a radio frequency (RF) signal form an antenna, comprising:
a transistor, coupled to the antenna, wherein the transistor comprising:
a first well;
a substrate, having a portion surrounding the first well;
a first doped region, disposed in the first well, and coupled to the antenna;
a second doped region, disposed in the first well, and coupled to the transmitting portion; and
a gate region, disposed on the first well between the first and second doped region; and
a first heavily doped region of a same type of dopant as the portion of the substrate; and
a first switch, configured to electrically couple the first heavily doped region to a first bias voltage according to a control voltage coupled to the gate region.

9. The radio frequency switch of claim 8, wherein the first switch is turned off when the transistor is turned on according to the control voltage, and the first switch is turned on when the transistor is turned off according to the control voltage.

10. The radio frequency switch of claim 8, wherein the transistor further comprising:
a second heavily doped region, having a same type of dopant as the first well, and disposed in the first well; and
a second switch, configured to electrically couple the first well to a second bias voltage through the second heavily doped region according to the control voltage coupled to the gate region.

11. The radio frequency switch of claim 8, wherein the portion of substrate is an entire substrate.

12. The radio frequency switch of claim 8, wherein the portion of substrate is a second well surrounding the first well.

13. The radio frequency switch of claim 12, wherein the transistor further comprises a third heavily doped region disposed in the substrate, and coupled to the substrate to a second bias voltage.

14. The radio frequency switch of claim 8, further comprising:
a resistor coupled in parallel with the first switch.

15. The radio frequency switch of claim 8, wherein the transistor includes a first transistor and a second transistor, and the first transistor is coupled between the antenna and a transmitting portion, and the second transistor is coupled to couple the antenna to a receiving portion.

16. A radio frequency switch, comprising:
a transistor, having a first terminal, a second terminal, a gate terminal, and a body;
a switch, coupled between the body of the transistor and a first bias voltage, and configured to couple the body of the transistor to a bias voltage when the transistor is turned off;
a first terminal, coupled to an antenna, and configured to receive a radio frequency signal received from the antenna; and
a second terminal, coupled to a receiving portion, and configured to receive the radio frequency signal received from the antenna through the transistor.

17. The radio frequency switch of claim 16, further comprising a resistor coupled in parallel with the first switch.

18. The radio frequency switch of claim 16, further comprising:
a control logic, configured to turn on the switch and turn off the transistor for disconnecting the first terminal and the second terminal, and configured to turn off the switch and turn on the transistor for connecting the first terminal to the second terminal.

19. The radio frequency switch of claim 16, further comprising:
a third terminal, coupled to a transmitting portion, and configured to receive a transmission signal to be transmitted from the transmitting portion,
wherein the transistor comprises a first transistor and a second transistor, and the first terminal is coupled to the second terminal through the first transistor, and the first terminal is coupled to the third terminal through the second transistor.

20. The radio frequency switch of claim 19,
wherein the first terminal of the first transistor is coupled to the antenna, and the second terminal of the first transistor is coupled to the transmitting portion, and
wherein the first terminal of the second transistor is coupled to the antenna, and the second terminal of the second transistor is couple to the receiving portion.

* * * * *